(12) United States Patent
Hirler et al.

(10) Patent No.: US 9,252,251 B2
(45) Date of Patent: Feb. 2, 2016

(54) SEMICONDUCTOR COMPONENT WITH A SPACE SAVING EDGE STRUCTURE

(75) Inventors: Franz Hirler, Isen (DE); Ralf Siemieniec, Villach (AT); Christian Geissler, Teugn (DE); Oliver Blank, Villach (AT); Maximilian Roesch, St-Magdalen (AT)

(73) Assignee: Infineon Technologies Austria AG, Villach (AU)

( * ) Notice: Subject to any disclaimer, the term of this patent is extended or adjusted under 35 U.S.C. 154(b) by 92 days.

(21) Appl. No.: 13/330,205

(22) Filed: Dec. 19, 2011

(65) Prior Publication Data

US 2012/0153386 A1      Jun. 21, 2012

Related U.S. Application Data

(63) Continuation-in-part of application No. 11/833,328, filed on Aug. 3, 2007, now Pat. No. 8,080,858.

(30) Foreign Application Priority Data

Aug. 3, 2006   (DE) .................. 10 2006 036 347

(51) Int. Cl.
| | |
|---|---|
| H01L 29/739 | (2006.01) |
| H01L 29/66 | (2006.01) |
| H01L 29/78 | (2006.01) |
| H01L 29/861 | (2006.01) |
| H01L 29/872 | (2006.01) |
| H01L 29/06 | (2006.01) |

(Continued)

(52) U.S. Cl.
CPC ........ *H01L 29/7397* (2013.01); *H01L 29/0623* (2013.01); *H01L 29/0653* (2013.01); *H01L 29/0661* (2013.01); *H01L 29/407* (2013.01); *H01L 29/66734* (2013.01); *H01L 29/7811* (2013.01); *H01L 29/7813* (2013.01); *H01L 29/861* (2013.01); *H01L 29/872* (2013.01); *H01L 29/0615* (2013.01); *H01L 29/0696* (2013.01); *H01L 29/404* (2013.01); *H01L 29/42376* (2013.01)

(58) Field of Classification Search
None
See application file for complete search history.

(56) References Cited

U.S. PATENT DOCUMENTS

| | | | |
|---|---|---|---|
| 4,941,026 | A | 7/1990 | Temple |
| 5,166,912 | A | 11/1992 | Kanesaka |

(Continued)

FOREIGN PATENT DOCUMENTS

| | | |
|---|---|---|
| CN | 101882593 | 11/2010 |
| DE | 103 12 911 | 10/2004 |

(Continued)

OTHER PUBLICATIONS

Office Action mailed Aug. 7, 2009 in U.S. Appl. No. 11/833,328.

(Continued)

*Primary Examiner* — Michael Jung
(74) *Attorney, Agent, or Firm* — Dicke, Billig & Czaja, PLLC

(57) ABSTRACT

A semiconductor component is disclosed. One embodiment includes a semiconductor body including a first semiconductor layer having at least one active component zone, a cell array with a plurality of trenches, and at least one cell array edge zone. The cell array edge zone is only arranged in an edge region of the cell array, adjoining at least one trench of the cell array, and being at least partially arranged below the at least one trench in the cell array.

23 Claims, 13 Drawing Sheets

(51) Int. Cl.
*H01L 29/40* (2006.01)
*H01L 29/423* (2006.01)

(56) References Cited

U.S. PATENT DOCUMENTS

| | | | |
|---|---|---|---|
| 5,763,915 | A | 6/1998 | Hshieh et al. |
| 6,534,830 | B2 | 3/2003 | Tihanyi et al. |
| 7,250,343 | B2 | 7/2007 | Kotek |
| 7,655,975 | B2 | 2/2010 | Hirler et al. |
| 8,080,858 | B2 | 12/2011 | Hirler et al. |
| 2003/0178676 | A1 | 9/2003 | Henninger et al. |
| 2004/0097049 | A1 | 5/2004 | Kawai |
| 2005/0082591 | A1* | 4/2005 | Hirler et al. ............ 257/302 |
| 2005/0145936 | A1* | 7/2005 | Polzl et al. ............. 257/341 |
| 2006/0006386 | A1 | 1/2006 | Hirler et al. |
| 2006/0118864 | A1 | 6/2006 | Hirler et al. |
| 2006/0131647 | A1* | 6/2006 | Meyer ................... 257/335 |
| 2006/0289928 | A1 | 12/2006 | Takaya et al. |
| 2008/0001217 | A1* | 1/2008 | Kawashima ........... 257/330 |
| 2008/0042172 | A1 | 2/2008 | Hirler et al. |
| 2008/0087951 | A1* | 4/2008 | Takaya et al. ......... 257/334 |
| 2008/0258208 | A1* | 10/2008 | Hirler et al. .......... 257/328 |
| 2009/0152667 | A1* | 6/2009 | Rieger et al. .......... 257/488 |

FOREIGN PATENT DOCUMENTS

| | | |
|---|---|---|
| DE | 103 53 387 | 6/2005 |
| DE | 10 2004 052 678 | 6/2006 |
| DE | 10 2006 036 347 | 4/2008 |
| JP | 07142713 | 6/1995 |
| WO | 0038242 | 6/2000 |
| WO | 2004107448 | 12/2004 |
| WO | 2006046388 | 5/2006 |
| WO | WO2006046388 A1 * | 5/2006 ............ H01L 29/78 |

OTHER PUBLICATIONS

Final Office Action mailed Feb. 23, 2011 in U.S. Appl. No. 11/833,328.
Office Action mailed Jun. 7, 2011 in U.S. Appl. No. 11/833,328.

* cited by examiner

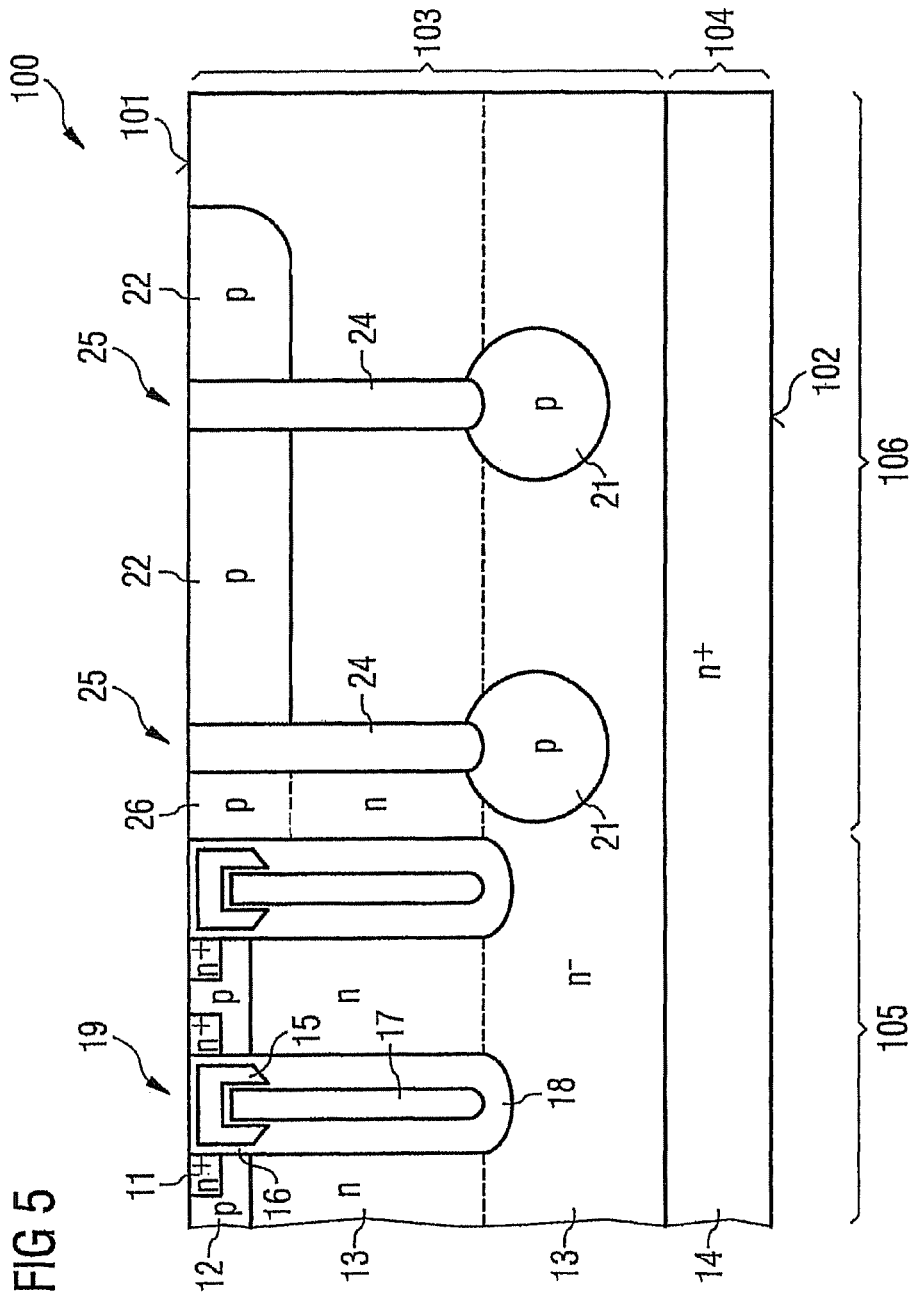

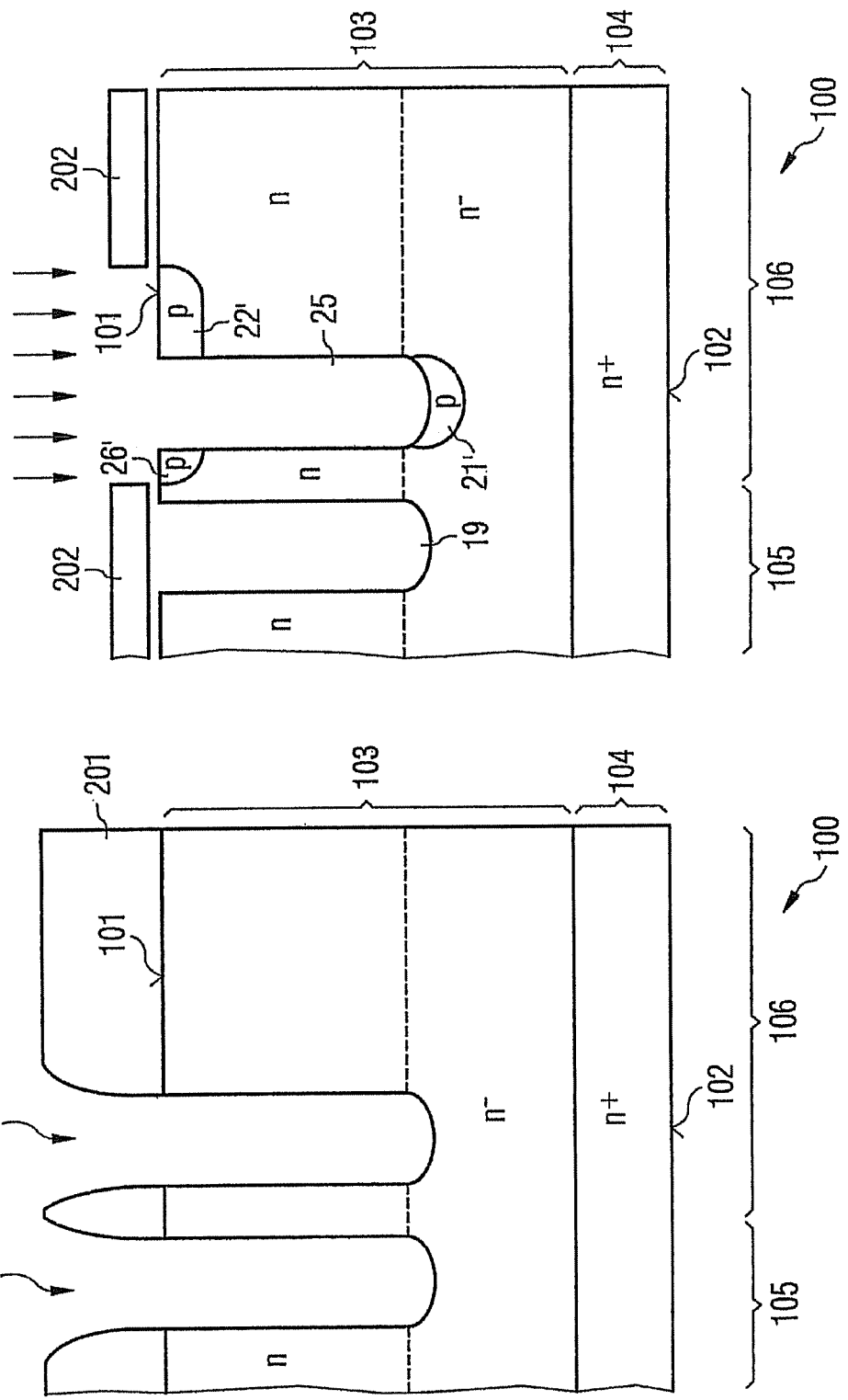

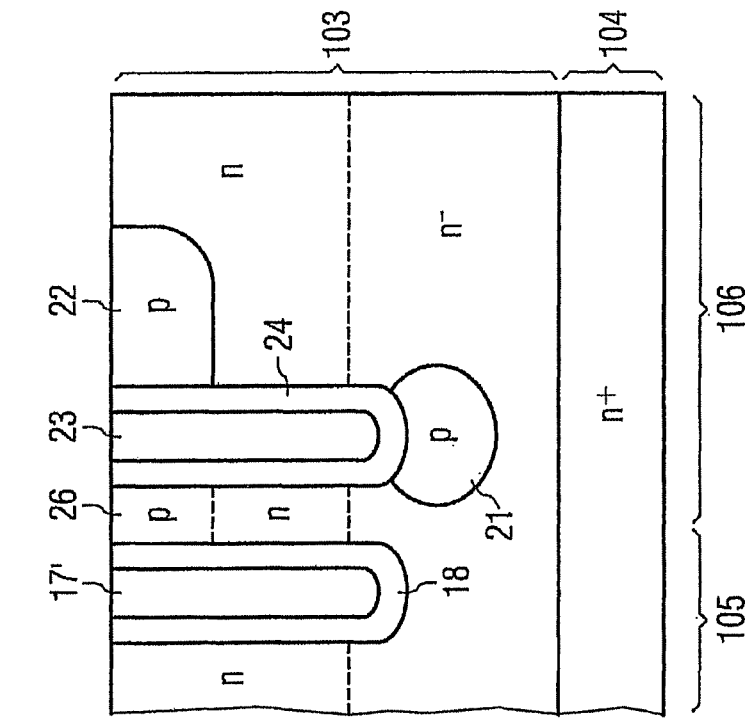
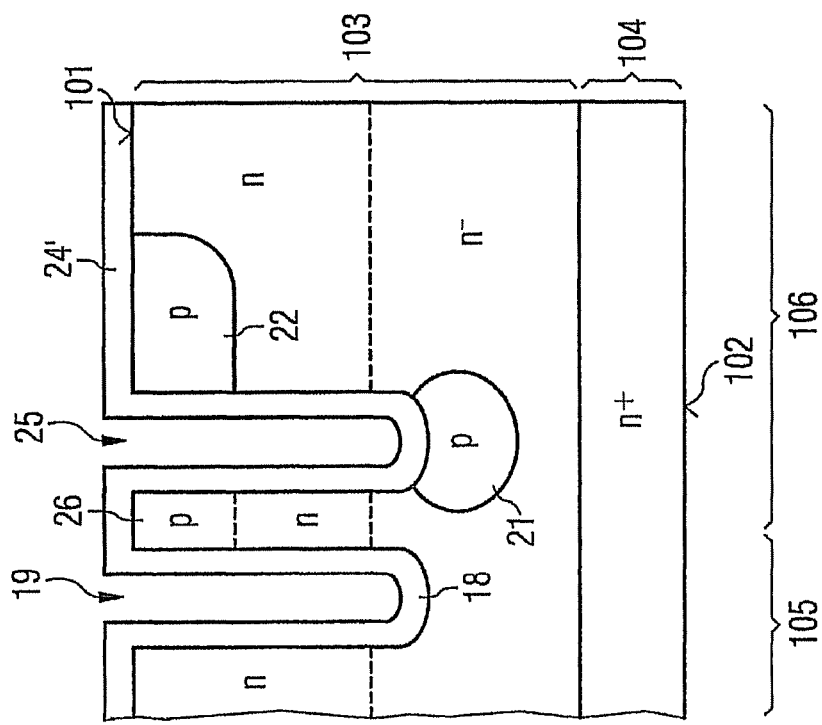
FIG 6C
FIG 6D

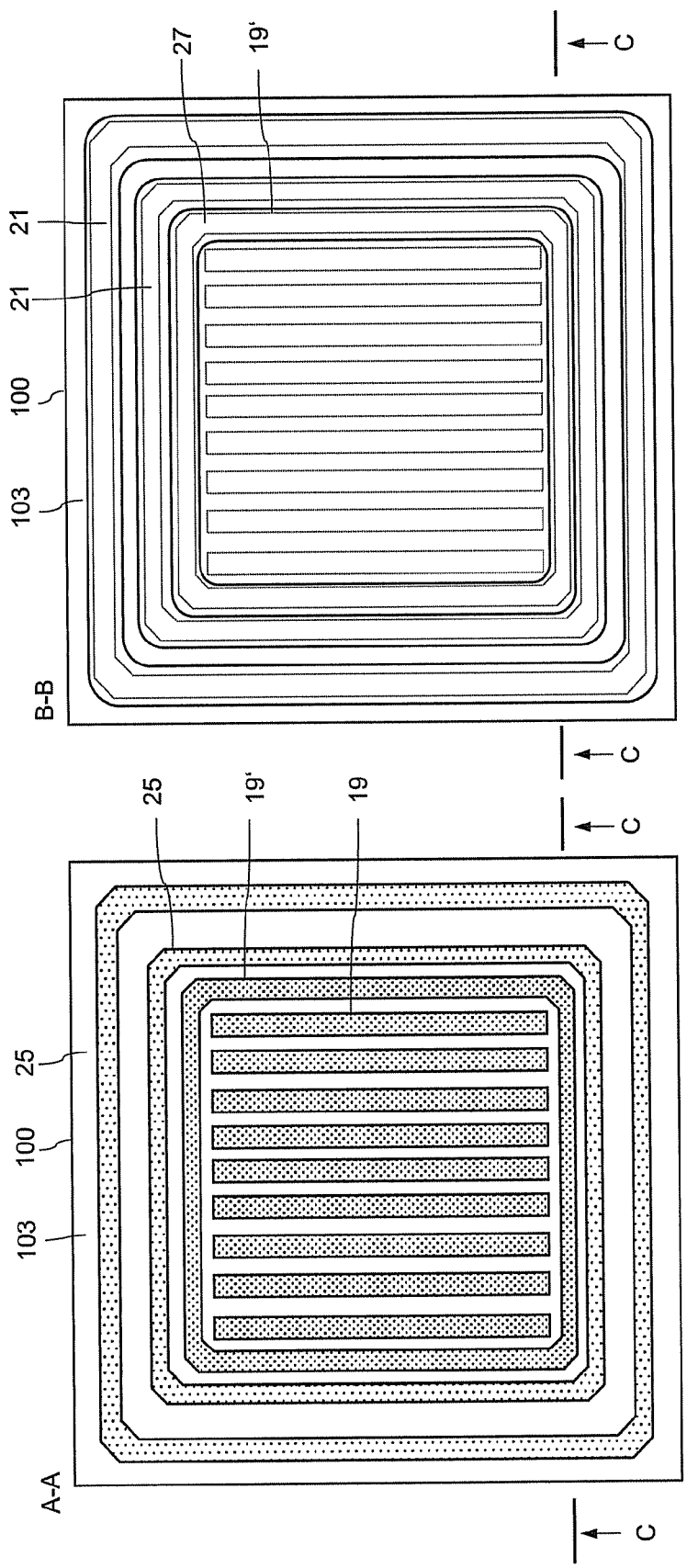

SEMICONDUCTOR COMPONENT WITH A SPACE SAVING EDGE STRUCTURE

CROSS-REFERENCE TO RELATED APPLICATIONS

This continuation-in-part patent application claims priority to U.S. patent application Ser. No. 11/833,328, filed on Aug. 3, 2007 and German Application No. DE 10 2006 036 347.7, filed on Aug. 3, 2006, which are both incorporated herein by reference.

TECHNICAL FIELD

Embodiments of the present invention relate to a semiconductor component, in particular a power transistor, comprising a semiconductor body having a pn-junction in an inner region of the semiconductor body and an edge structure in an edge region of the semiconductor body.

BACKGROUND

A component structure with a semiconductor junction, i.e. a pn-junction, exists both in bipolar components, like diodes, bipolar transistors and IGBTs, and in unipolar components, like MOSFETs. These components differ in terms of their behaviour in conducting state. However, common to these components is that in blocking state starting from the semiconductor junction a space charge zone expands with increasing blocking voltage.

In vertical components the pn-junction is basically parallel to one of the sides of a semiconductor body. Without taking additional measures the voltage proof (maximum blocking voltage) is reduced in those areas which adjoin the pn-junction an a lateral direction. Usually this is the edge region of the semiconductor body, i.e. the region being adjacent to a side surface or edge surface, of the semiconductor body, with the edge surface running in a vertical direction between a front side and a back side of the semiconductor body. The region with the pn-junction usually forms the inner region, which is usually larger in terms of its area size than the edge region.

To increase the voltage proof in the edge region, and to therefore concentrate an avalanche breakdown in the larger inner region upon reaching a maximum blocking voltage, different edge terminations or edge structures are known. These edge terminations serve to reduce the curvature of electric field lines in the edge region when applying a blocking voltage to the component, and therefore serve to reduce the field strength in the edge region as compared to the field strength in the inner region.

SUMMARY

A semiconductor component according to a first embodiment includes a semiconductor body comprising a first side and a second side, and a first semiconductor layer having a basic doping of a first conductivity type, at least one active component zone of a second conductivity type, which is complementary to the first conductivity type, in the first semiconductor layer, a cell array with a plurality of trenches, each trench including a field electrode and a field electrode dielectric, and at least one cell array edge zone of the second conductivity type. The cell array edge zone is in the cell array only arranged in an edge region of the cell array, adjoins at least one trench of the cell array, and is at least partially arranged below the at least one trench in the cell array.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 5 illustrates a semiconductor component realized as a MOS transistor, with the component comprising an edge structure with several trenches, with each of the trenches being filled with a dielectric.

FIG. 6A-6D illustrate a process steps for producing an edge structure according to FIGS. 1 and 2.

FIG. 8 illustrates a horizontal cross sectional view of the semiconductor component of FIG. 7 in a first horizontal plane.

FIG. 9 illustrates a horizontal cross sectional view of the semiconductor component of FIG. 7 in a second horizontal plane.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
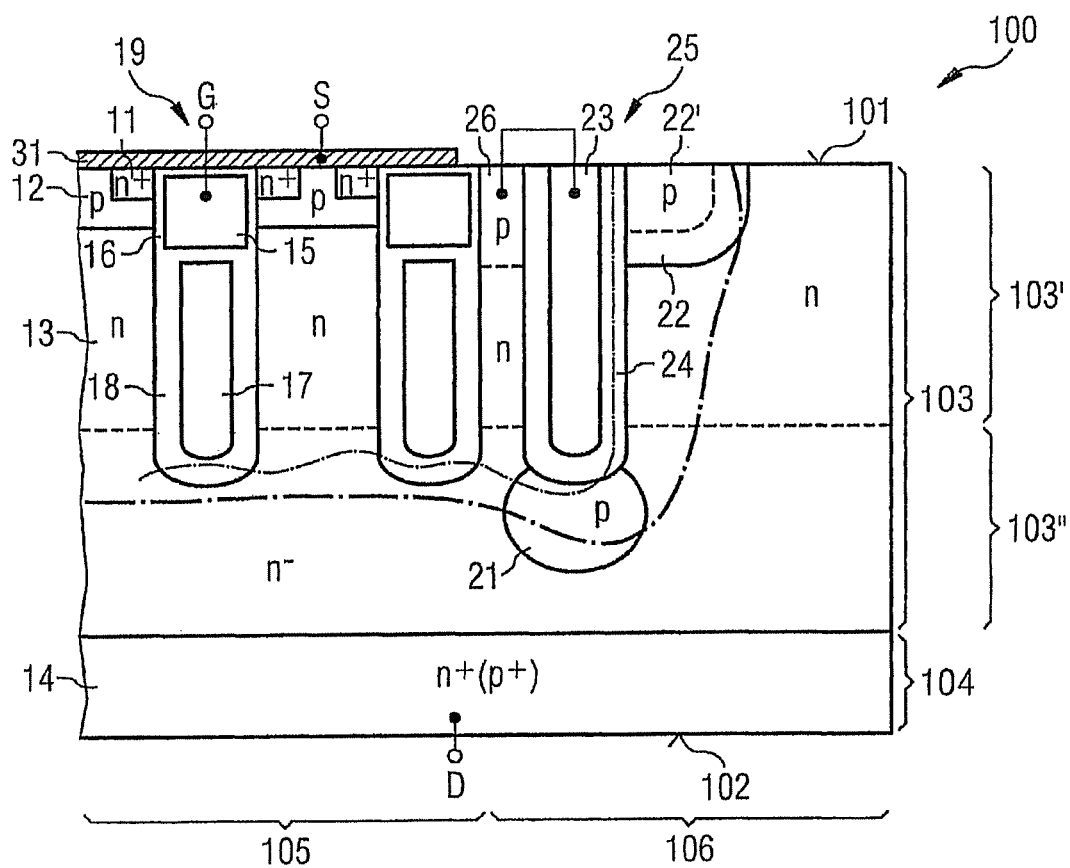
FIG. 1 illustrates a semiconductor component realized as a MOS transistor, with the component comprising an edge structure having a trench and an edge electrode disposed in the trench.

FIG. 1 shows a vertical cross sectional view of a section of a semiconductor component according to a first embodiment. The semiconductor component includes a semiconductor body 100 having a first side 101, also referred to as front side in the following, and a second side 102, also referred to as back side in the following. The back side 102 is disposed opposed to the front side 101 in a vertical direction of the semiconductor body 100. The semiconductor body 100 comprises a first semiconductor layer 103 having a basic doping of a first conductivity type. Just for illustration purposes, the first conductivity type is an n-type in the embodiment of FIG. 1.

First semiconductor layer 103, which adjoins the front side 101 of the semiconductor body 100, is, for example, an epitaxial layer 103 that is disposed on a second semiconductor layer 104, with the second semiconductor layer 104, for example, being a semiconductor substrate. It should be noted that dimensions of the first and second semiconductor layers 103, 104 of FIG. 1 in vertical direction are not to scale. Usually, when realizing the first semiconductor layer 103 as an epitaxial layer on a substrate 104, the dimensions of the epitaxial layer 103 in vertical direction of semiconductor body 103 are significantly smaller than the dimensions of the semiconductor substrate 104.

Semiconductor body 100 comprises an inner region 105 and an edge region 106 adjoining the inner region 105 in a lateral direction of semiconductor body 100. Disposed in the first semiconductor layer 103 and in the inner region 105 of semiconductor body 100 is an active component zone 12 of a second conductivity type, which is a p-doped zone according to the example. Active zone 12 together with an adjoining region of semiconductor layer 103 that has the n-basic doping forms a pn-junction. In the example of FIG. 1 active component zone 12 is part of a transistor structure of a trench MOS transistor, being realized in inner region 105 of the semiconductor body. p-doped active component zone 12 forms a body zone of the transistor, which, in a vertical direction of the semiconductor body 100, is disposed between a source zone 11 and a drift zone 13. Source zone 11 and drift zone 13 are doped complementary to the body zone 12. A section of the semiconductor layer 103 that has the basic doping and that extends from body zone 12 to semiconductor substrate 104 in a vertical direction forms the drift zone 13 in this component. The semiconductor substrate 104 forms a drain zone 14 of the MOS transistor.

For controlling an inversion channel in body zone 12 between source zone 11 and drift zone 13 the component comprises a gate electrode 15. The gate electrode 15 is disposed in a trench 19 that extends from the first side 101 in a vertical direction into semiconductor body 100. According to the example in FIG. 1, gate electrode 15 is disposed adjacent to body zone 12 in lateral direction of the semiconductor body 100, and is dielectrically insulated against body zone 12 using a gate dielectric 16. In vertical direction of the semiconductor body 100 gate electrode 15 extends from source zone 11 to drift zone 13.

In the inner region 105 of semiconductor body 100 a number of identical transistor structures, each having a gate electrode 15, a source zone 11 and a body zone 12, may be formed. These identical transistor structures will be denoted as transistor cells in the following. These transistor cells are connected in parallel by electrically connecting their source zones 11 with each other. In the component according to FIG. 1 this is achieved by using source electrode 31 which is disposed above the front side of semiconductor body 100 and which contacts the source zones 11 of the individual transistor cells. Further, source electrode 31 short-circuits source zones 11 and body zones 12 of the transistor cells in known manner. Drift zone 13 as well as drain zone 14 are common to all transistor cells in this component. The transistor cells connected in parallel form a so-called cell array.

In the same trenches 19 as the gate electrodes 15 field electrodes 17 may be disposed, which, in a vertical direction, are disposed below the gate electrodes 15, and, in a lateral direction, are disposed adjacent to sections of drift zone 13. These field electrodes 17 in the trenches are insulated against the first semiconductor layer 103 by field electrode dielectric 18, with the field electrode dielectric being thicker as compared to the gate dielectric 16. In a manner not shown in detail field electrodes 17 may be connected to source zones 11, or the source electrode 31, respectively, with the field electrodes 17 thereby having a source potential of the component. Field electrodes 17, in a known manner, serve to compensate a part of the doping charge present in drift zone 13 when the component is blocking (turned off), thereby increasing the voltage proof of the component. The doping charge results from doping the drift zone with dopants.

The transistor structure of FIG. 1 blocks, when there is no drive potential present at the gate electrode 15 suitable for effecting an inversion channel in the body zone 12, and when a voltage is present between a drain terminal D (connected to drain zone 14) and the source terminals that blocks the pn-junction between body zone 12 and drift zone 13. The blocking voltage for the n-MOSFET of FIG. 1 is a positive voltage between drain D and source S. For a p-MOSFET, in which the individual component zones are doped complementary to the component zones of the component of FIG. 1, this voltage is a negative voltage between drain and source.

When a blocking voltage is applied to the component a space charge zone starting from the pn-junction extends in inner region 105 in vertical direction of the semiconductor body 100. The space charge zone extends further with increasing blocking voltage until a maximum voltage proof of the component is reached and avalanche breakthrough sets in. In the edge region 106 the component comprises an edge structure. Edge structure serves to obtain a voltage proof in the edge region being at least the voltage proof of the component in the inner region 105. It should be noted in this connection that "edge region" not necessarily is a region of the semiconductor body 100 which is close to a lateral edge of the semiconductor body 100. "Edge region" in connection with the present invention is a region of the semiconductor body which adjoins a semiconductor region in a lateral direction, with the semiconductor region comprising active component areas of a vertical power semiconductor component. Besides a power MOSFET as shown in FIG. 1 such vertical power semiconductor component may be a power IGBT or a power diode which will be explained with reference to FIG. 2 herein below. Starting from the component according to FIG. 1 a power IGBT is obtained by doping the drain zone complementary to the drift zone 13.

In the component according to FIG. 1 the edge structure comprises a further trench 25, which starting from the front side 101 extends in vertical direction into the semiconductor body. An electrode, which will be referred to as edge electrode in the following, is disposed in this trench 25 and is dielectrically insulated against the first semiconductor layer 103 by a dielectric layer.

The edge structure further comprises a first edge zone 21, with the first edge zone 21 being doped complementary to the basic doping of semiconductor layer 103, directly adjoining edge trench 25, and being at least partially disposed below edge trench 25 in the vertical direction. The edge structure further comprises an optional second edge zone 22, with the second edge zone 22 directly adjoining the edge trench in the lateral direction of the semiconductor body 100, and adjoining the front side 101 in the vertical direction. The second edge zone 22 is doped complementary to the basic doping of the first semiconductor layer 103, and, in the example, adjoins the trench in a direction opposite to the direction of the cell array.

The component may further comprise an edge zone 26 between the edge trench 25 and the outermost trench of the transistor cell array, with the outermost trench being the trench disposed closest to the edge region 106. The further edge zone 26 is doped complementary to the basic doping of first semiconductor layer 103. The edge zone 26 reaches from edge trench 25 to the outermost "transistor trench" lying of the transistor cell array, with the transistor trench having gate electrode 16 and field electrode 17 disposed therein. In this component edge electrode 23 is connected to further edge zone 26 between edge trench 25 and the cell array.

Alternatively to connecting edge electrode 23 to the further edge zone 26, edge electrode 23 may be connected to source electrode 31 (not shown).

Semiconductor layer 103, that, in the inner region of the semiconductor body, forms the drift zone 13 of the MOS transistor, may comprise two differently doped partial layers: a first partial layer 103', adjoining active component zone 12; and a second partial layer 103", adjoining first partial layer 103' and being lower doped than first partial layer 103'. Such sub-division of semiconductor layer 103 in two partial layers 103', 103" is depicted in dashed lines in FIG. 1. Lower doped partial layer 103" is basically disposed below the trench structure of the cell array and the edge structure, where trenches 19, 25 may extend into lower doped partial layer 103". First edge zone 21 may completely disposed in lower doped partial layer 103".

By sub-dividing semiconductor layer 103 in a lower doped second partial layer 103" and a higher doped first partial layer 103' the semiconductor component comprises a higher doped drift zone section in the region of field electrodes 17, and a lower doped drift zone section. The lower doped drift zone section increases the voltage proof of the component and is not depleted/compensated by field electrodes 17 in a lateral direction.

For comparison reasons lets assume that a reference component exists that has a drift zone which is completely doped as high as the first partial layer 103' of the component according to FIG. 1, and that has no field electrode. The doping concentration of the higher doped partial layer 103' of the present component as compared to the doping concentration of lower doped partial layer 103' is selected such that the voltage proof of the reference component is less than 50% of the voltage proof of the present component. In other words: the voltage proof of the present component is more than two times the voltage proof of the reference component.

When the component blocks the edge structure serves to influence the course of field lines in the semiconductor body. In FIG. 1 two equipotential lines of the electric field are depicted in dash-dot lines. These equipotential lines run in a lateral direction in the inner region 105 and in the edge region 106 bent into the direction of the front side 101, without a higher electric field occurring in the edge region 106 as compared to inner region 105. To increase the voltage proof in the edge region 106 as compared to the voltage proof in the inner region 105 a mutual distance between equipotential lines in the edge region is increased by the edge structure according to FIG. 1. The dielectric layer 24 surrounding field electrode 23 serves to absorb a bigger part of the blocking voltage in the edge region and bents the equipotential lines in the direction of the front side. However,—without taking further measures—bending the equipotential lines would result in an increase of the electric field strength in the semiconductor material, silicon for example, below the trenches 25. First edge zone 21 adjoining the trench serves to avoid such increase in the electrical field strength and reduces the electric field in the semiconductor material below the trenches when the component blocks state. In this connection the doping concentration of the first edge zone 21 is selected such, that it may be completely depleted, or that it may be depleted except for a region having dimensions smaller than the width of trench 25 in lateral direction. It should be noted, that the dimensions of first edge zone 21 in lateral direction of the semiconductor body 100 are usually—but not necessarily— larger than the dimensions of the trench 25 in this direction.

Second edge zone 22 serves to "shift" the equipotential lines from edge trench further in the direction of the edge to avoid an increase in the electric field below the trenches due to bending the equipotential lines in this region. The doping concentration of second edge zone 22 may be selected such, that it may not be depleted completely. In the latter case only in parts of the second edge zone 22 an electric field is present, when the component blocks, while in parts of second edge zone 22 no electric field is present. This is equivalent to the fact that a doping charge present in the second edge zone 22 is higher than a breakthrough charge of the used semiconductor material.

In the example second edge zone 22 of edge structure starting from front side 101 extends deeper into semiconductor body 100 in the vertical direction as compared to the active component zones forming the pn-junction (body zone 12 and inner region 105).

In a direction vertical to the drawing plain of FIG. 1 trenches may be elongated, where the further component zones of the transistor structure may run elongated in this direction, either. Edge structure is ring-shaped and surrounds the transistor structure of the inner region 105 in a manner not shown in detail.

Figure 2:
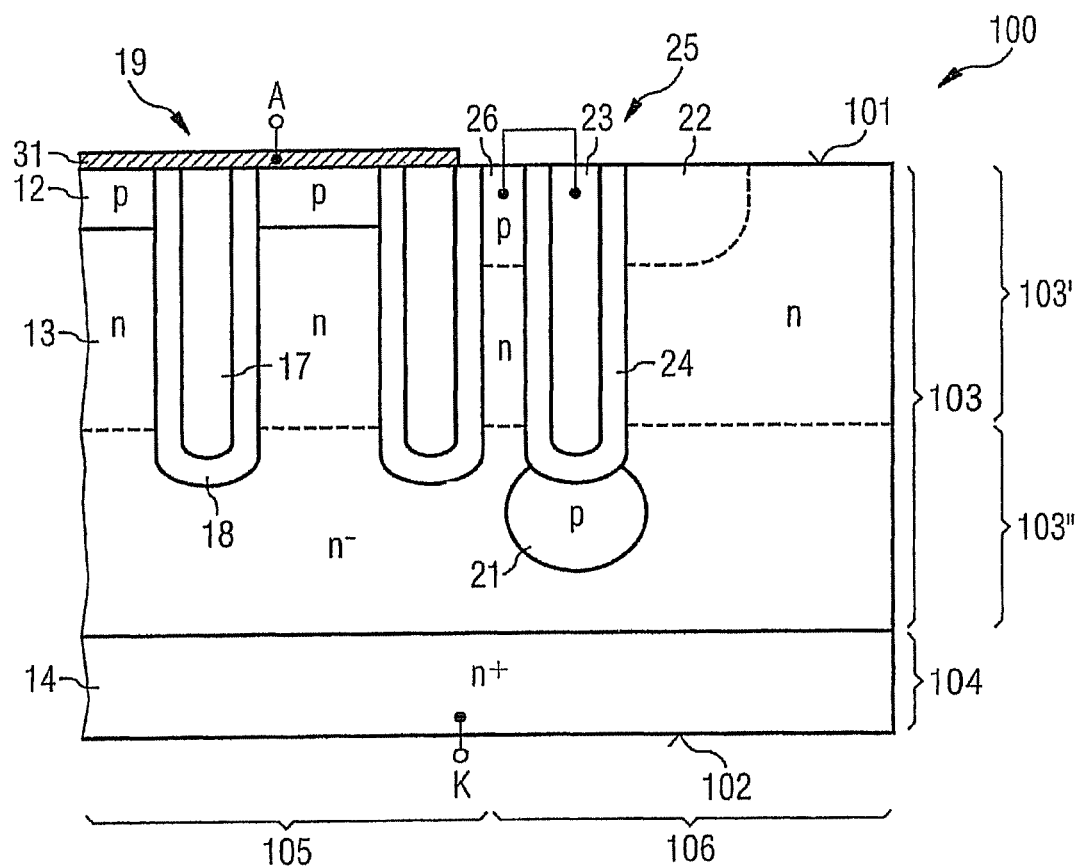
FIG. 2 illustrates a semiconductor component formed as a diode, with the semiconductor component comprising an edge structure having a trench and an edge electrode disposed in the trench.

FIG. 2 illustrates a semiconductor component realized as a diode. An edge structure disposed in an edge region 106 of semiconductor body 100 corresponds to the edge region of the power transistor according to FIG. 1. Inner area 105 in the component according to FIG. 2 comprises a diode structure having a p-doped active component zone 12, a first n-doped semiconductor zone 13 adjoining p-doped zone 12, and a second n-doped semiconductor zone 14 adjoining first n-doped semiconductor zone 13. First n-doped zone 13 is formed by sections of semiconductor layer 103 having the basic n-doping. Second n-doped semiconductor zone 14 is doped higher than n-zone 13 and is formed by semiconductor substrate 104. Between the p-zone 12 forming a p-emitter of the transistor structure and the first n-zone 13 forming a n-basis of the transistor structure a pn-junction is present. Second n-zone 14 forms the n-emitter of the diode. The diode structure further comprises trenches, which starting from the front side 101 extend into the semiconductor body. In the trenches field electrodes 17 are disposed adjacent to the n-basis 13, where the field electrodes 17 are insulated against the n-basis 13 using a field electrode dielectric 18. Field electrodes 17, for example, may be connected to an anode electrode 31, which is disposed above front side 101 and which contacts p-emitter zones 12 (anode zones) of the diode structure. n-emitter 14 is connected to a cathode electrode K, which is schematically shown.

p-emitter 12 of the diode according to FIG. 2 may be replaced by a Schottky-metal-zone (not shown), to obtain a Schottky diode instead of the bipolar diode.

Figure 3:
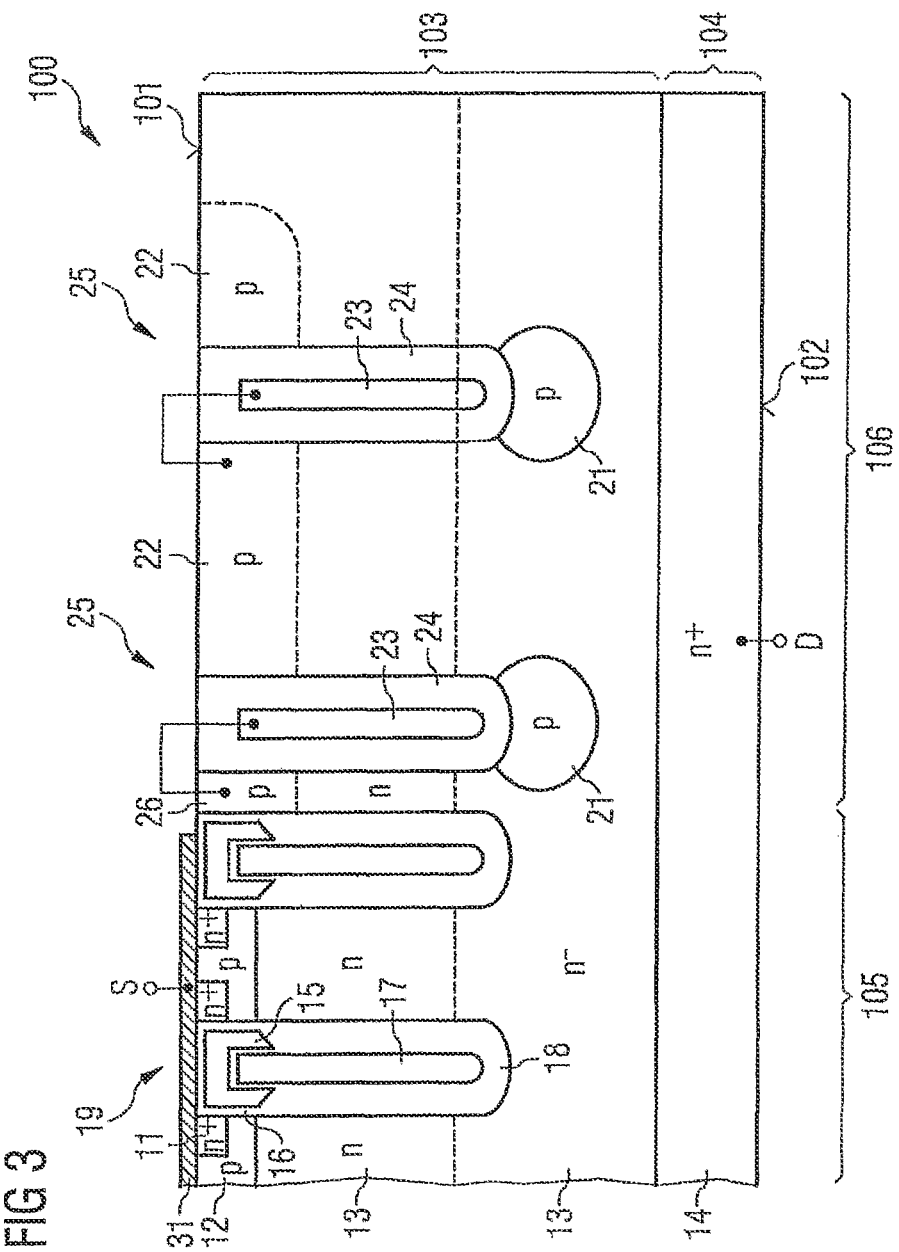
FIG. 3 illustrates a semiconductor component realized as a MOS transistor, with the component having an edge structure with several trenches and edge electrodes disposed in the trenches.

FIG. 3 illustrates a semiconductor component which is modified as compared to the semiconductor component of FIG. 1 and which is rated for higher blocking voltages. The component comprises an edge structure having several—two, according to the example—edge trenches 25. Associated with each edge trench is a first edge zone 21, with each of these first edge zones 21 being doped complementary to the basic doping of semiconductor layer 103, and being disposed at least partially below the trenches 25. Further, optional second edge zones 22 are associated with each of these trenches 25, with each of these second edge zones 22 being doped complementary to the basic doping of semiconductor layer 103, adjoining the trenches 25 in a lateral direction, and directly adjoining the front side of the semiconductor body. The second edge zone 22—corresponding to the second edge zone 22 of the component according to FIG. 1—of the outermost trench 25 in this edge structure adjoins the trench 25 in a direction which is opposite to the direction of the inner region 105. Second edge zones 22 associated with the further trenches— only one further trench in FIG. 1—extend in lateral direction between adjacent edge trenches.

The component as illustrated further comprises a further edge zone 26 which is disposed between an edge trench 25 closest to the cell array and the outermost transistor trench of the cell array. Edge electrode 23 of the edge trench 25 being disposed closest to the cell array is connected to further edge zone 26. Edge electrode 23 of edge trench 25 which is disposed distant to the cell array is connected to a second edge zone 22 which, in the direction of the cell array, is disposed between this edge trench and an adjacent edge trench. For further increasing the voltage proof further edge trenches with edge electrodes may be provided (not shown). Each of these edge electrodes are connected to a semiconductor zone, being disposed adjacent to the trenches in the direction of the cell array, and being doped complementary to the basic doping of the semiconductor layer 103. Referring to the example of FIG. 3 these semiconductor zones are the second edge zone 22 between the two edge trenches 25 and further edge zone 26.

The transistor cell array of the component according to FIG. 3 is modified as compared to the transistor cell array of the component according to FIG. 1. Transistor cells of the cell array of FIG. 3 differ from the transistor cells of FIG. 1 in that the field electrodes 17 in a vertical direction extend up to a level of the body zones 12, but are surrounded by the gate electrode 16 within the trenches. This particular form of the field electrodes 17 and the gate electrodes 15 is the result of a manufacturing process, in which first field dielectric layer 18 and than the field electrodes 17 are produced. The field electrodes 17 and field dielectric layer 18 are then etched away in upper regions of the trenches prior to producing gate electrodes 15. It should be noted that the transistor structure according to FIG. 3 may have an edge structure according to FIG. 1 as well.

Referring to FIGS. 1 and 2 edge electrodes 23 may extend up to the front side 101 of semiconductor body 100. However, referring to FIG. 3 field electrodes 23 may either be disposed below front side 101 and may be covered by a dielectric layer disposed between the front side and the edge electrodes 23.

Figure 4:
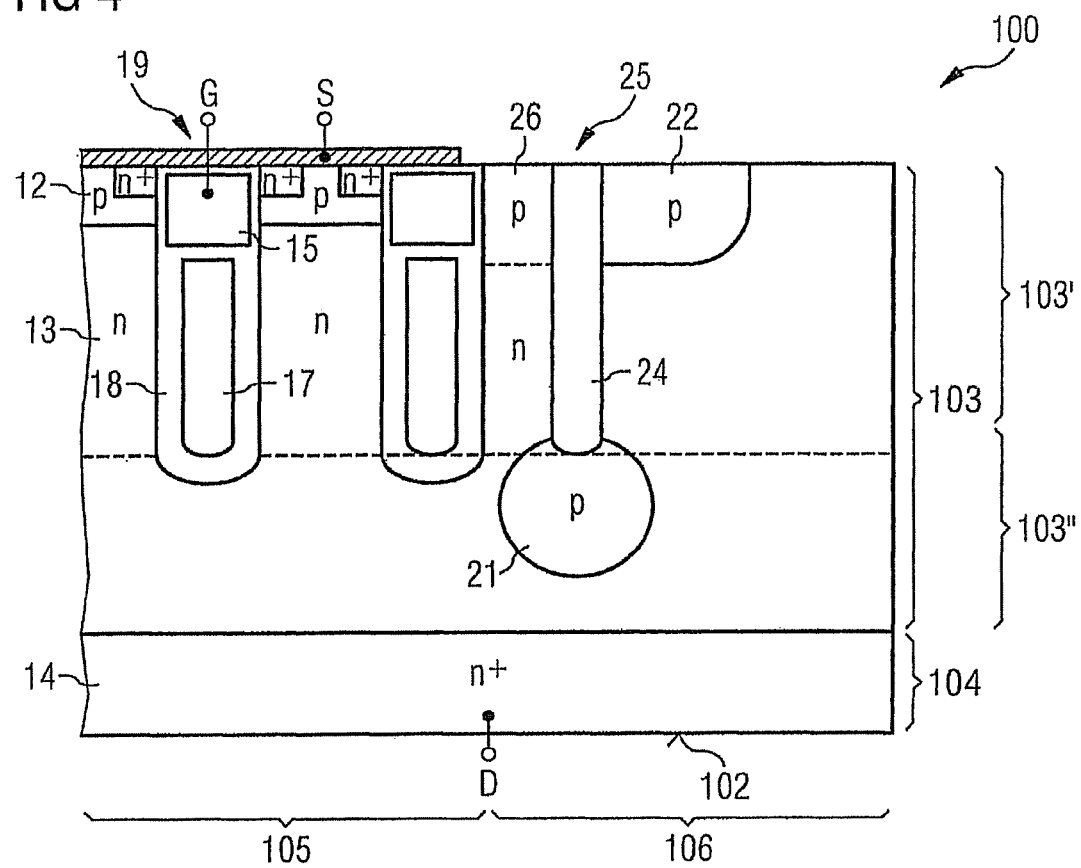
FIG. 4 illustrates a semiconductor component realized as a MOS transistor, with the component having an edge structure comprising a trench filled with a dielectric.

FIG. 4 illustrates a semiconductor component which is modified as compared to the semiconductor component of FIG. 1. The semiconductor component of FIG. 4 comprises an edge structure in edge region 106, with the edge structure having a trench 25 being completely filled with an edge dielectric layer 24. The edge structure further comprises a first edge zone 22, being doped complementary to the basic doping of semiconductor layer 103, directly adjoining the trench 25, and in a vertical direction of the semiconductor body 100 being disposed at least partially below trench 25. A doping concentration of the first edge zone 21 is selected such, that the first edge zone 21 is depleted completely, when the component blocks, or is depleted except for an area having dimensions smaller than a width of trench 25 in a lateral direction. When the component blocks all dopants or at least a bigger part of dopants in the first edge zone 21 are ionized.

The edge structure according to FIG. 4 comprises an optional second edge zone 22, with the second edge zone 22 adjoining the trench 25 in a lateral direction opposite to the direction of the inner region 105, and adjoining the front side 101 in a vertical direction. Second edge zone 22 in the vertical direction extends deeper into the semiconductor body as compared to active component zone 12—the body zone in the example. Further, the component comprises an optional further edge zone 26, with the further edge zone 26 being doped complementary to the basic doping of semiconductor layer 103, being disposed between edge trench 25 and the outermost trench of the transistor structure, and extending from the edge trench 25 to the transistor trench. A doping charge or doping concentration of second edge zone 22 may be selected such, that second edge zone 22 may not be completely depleted.

Corresponding to the components of FIGS. 1 to 3 the semiconductor components of FIGS. 4 and 5 (which will be explained below) may comprise two differently doped partial layers. A higher doped partial layer 103' is present in an upper region of semiconductor body 100, in which the trenches 19 with the gate electrodes 15 and the field electrodes 17 are disposed, and a lower doped layer 103" is disposed between higher doped layer 103' and substrate 104, with the substrate forming a drain zone 14 in the example. Trench 25 (FIG. 4) and trenches 25 (FIG. 5) with the dielectric 24 may extend through higher doped partial layer 103' into the lower doped layer 103". A bigger part of first edge zone 21 is disposed in the lower doped partial layer 103".

FIG. 5 illustrates an edge structure which is modified as compared to the edge structure according to FIG. 4. The edge structure of FIG. 5 comprises several—two in the example— edge trenches 25, being completely filled with edge dielectric layers 24. Associated with each of these edge trenches 25 is a first edge zone 21, with the first edge zones 21 being at least partially disposed below the trenches 25, and having a doping charge or doping concentration selected such that they may be depleted completely or except for a region having dimensions smaller than a width of the trench. Optional second edge zones 22 may further be associated with each of these trenches, with the second edge zones 22 adjoining the trenches in a lateral direction and adjoining the front side 101 in a vertical direction.

The edge structures explained with reference to FIGS. 1 to 5 are—in particular—suitable for semiconductor components comprising a semiconductor layer 103 having two differently doped partial layers: a first partial layer 103', adjoining the active component zone 12, and a second partial layer 103", adjoining the first partial layer 103' and being lower doped than the first partial layer 103'. Referring to FIGS. 1 to 5, in which a sub-division of semiconductor layer 103 in two partial layers is depicted in dashed lines, the lower doped partial layer 103" is basically disposed below the edge structure. Lower doped partial layer 103" serves to increase the voltage proof of the component. The edge structure may be disposed in the higher doped first partial layer 103'.

A possible method for producing the edge structures of FIGS. 1 to 3 will be explained with reference to FIG. 6 in the following. FIG. 6A shows a cross section through the semiconductor body 100 after first process steps, in which trenches are etched into the semiconductor body 100 via the front side 101 using an etch mask 201 disposed on the front side. Trench etching is performed in the inner region 105 for producing the trenches that serve to accommodate the gate electrodes of the transistor structure, and in the edge region 106 for producing at least one trench accommodating edge electrode 23. Reference character 19 in FIG. 6A denotes a trench of inner region 105, and reference character 25 a trench of edge region 106.

FIG. 6B illustrates the method during further process steps, in which using a further mask 202 dopants are implanted into semiconductor body 100. Mask 202, which, for example, is a diaphragm/face plate and disposed above the front side 101, is selected such, that dopants are implanted into semiconductor layer 103 via the ground of edge trench 25, and that dopants via the front side 101 are implanted in areas of semiconductor layer 103 adjoining the trench 25 in lateral direction.

Mask 202 that is used for masking the semiconductor body 100 during the implantation process may be disposed distant to the front side 101 of the semiconductor body. Further, a scattering layer (not shown) may be disposed on the front side 101 of the semiconductor body 100 and on uncovered surfaces of the trenches. Dopants are then implanted through the scattering layer into semiconductor body 100. Given an implantation energy scattering layer effects a variation of implantation depths. Diaphragm/mask in this method may be disposed distant to the scattering layer or may directly adjoin the scattering layer.

Implanted regions resulting from the implantation are denoted with reference characters 21', 22' in FIG. 6B. These implanted regions 21', 22' are the basis for the first and second edge zones 21, 22. Mask 202 is selected such, that an implantation of dopants into the trenches 19 of inner region 105 is prevented. However, mask 202 may be selected such, that dopants are implanted into the semiconductor region between the edge trench 25 and the outermost transistor trench 19, for forming a further implanted zone 26'. Further implanted zone 26' is the basis for further edge zone 26. Following the implantation an annealing step may be performed for annealing crystal defects resulting from the implantation, and for electrically activating implanted dopants. The temperature of the annealing step is, for example, in the range between 1000° C. and 1200° C., in particular between 1050° C. and 1100° C.

FIG. 6C illustrates the semiconductor body 100 after further process steps, in which—after removing mask 202—a dielectric layer 24' is deposited on the complete semiconductor surface, i.e. on the front side 101 as well as in the trenches 19, 25. The dielectric layer is, for example, a thermal semiconductor oxide produced by an oxidation process, or a deposited oxide. Dielectric layer 24' in trench 19 of the inner region 105 forms the later field electrode dielectric and in edge trench 25 forms the later edge dielectric. During the process of producing dielectric layer 24' temperature processes are required, which make the previously implanted dopants diffuse deeper into the semiconductor body 100. Edge zones 21, 22, 26 of edge structure result from this diffusion process. It should be noted, that during further process steps for producing or finishing the semiconductor component further temperature processes may be required, which result for the previously implanted dopants to diffuse even deeper into the semiconductor body.

FIG. 6D illustrates the semiconductor body after further process steps, in which the trenches 19, 25 are filled with an electrode material for forming edge electrode 23 in the edge trench, and for forming a precursor of later field electrode 17 in the inner region 105.

Following these process steps further process steps are performed for producing the transistor structure in inner region 105 of the semiconductor body, with these process steps are not shown in the figures. Edge region 106 of semiconductor body 100 is masked during these process steps.

A process of manufacturing the edge structure according to FIGS. 4 and 5 having trenches being completely filled with dielectric 24 is different from the method according to FIGS. 6A to 6C in that an opening of mask 201 for producing the edge trench 25 is smaller than openings of the mask 201 for producing the transistor trenches 19. When depositing the dielectric layer (24' in FIG. 6C) edge trench 25 is completely filled with dielectric material, while a space remains in the transistor trench 19, with the space being later filled with an electrode material. During the etch process the smaller width of edge trench 25 as compared to the width of transistor trench 19 results to a smaller vertical dimension of edge trench 25 as compared to transistor trench 19. This is shown in FIGS. 4 and 5. In the components of FIGS. 4 and 5 a smaller width of edge trenches 25 as compared to trenches 19 of the cell array is required, if dielectric 24 of edge trenches 25 is to be produced by the same process steps as field plate dielectric 18. Producing the dielectric is performed by either growing an oxide layer or by depositing a dielectric layer, where in both cases edge trench 25 is to be filled completely, while trench 19 of the cell array is to be filled not completely.

In edge structures having an edge electrode 23 and an edge dielectric 24 disposed in a trench, as well as in edge structures having a trench being completely filled with a dielectric, edge trench 25 may be realized such, that edge trench 25 extends deeper into the semiconductor body 100 as compared to the trenches of the cell array (not shown). In an edge structure having several edge trenches at least the edge trench being disposed closest to the cell array extends deeper into the semiconductor body.

Producing an edge trench extending deeper into the semiconductor body as compared to trenches of the cell array may be performed simultaneously with producing the trenches of the cell array. In this connection an etch mask for etching the trenches is selected such, that the edge trench in a lateral direction of the semiconductor body 100 is wider than the trenches of the cell array. During a given duration of the etching process an edge trench is formed that is deeper as compared to trenches of the cell array. To completely fill a wider, and therefore deeper, edge trench with a dielectric layer in order to obtain an edge structure according to FIGS. 4 and 5, two process steps may become necessary: in a first process step, which produces the field plate dielectric 18 in the trenches 19 of the cell array, the edge trench is partially filled with a dielectric; in a second process step the edge trenches are completely filled with a dielectric, for example by separately depositing a dielectric in the edge region.

Figure 7:
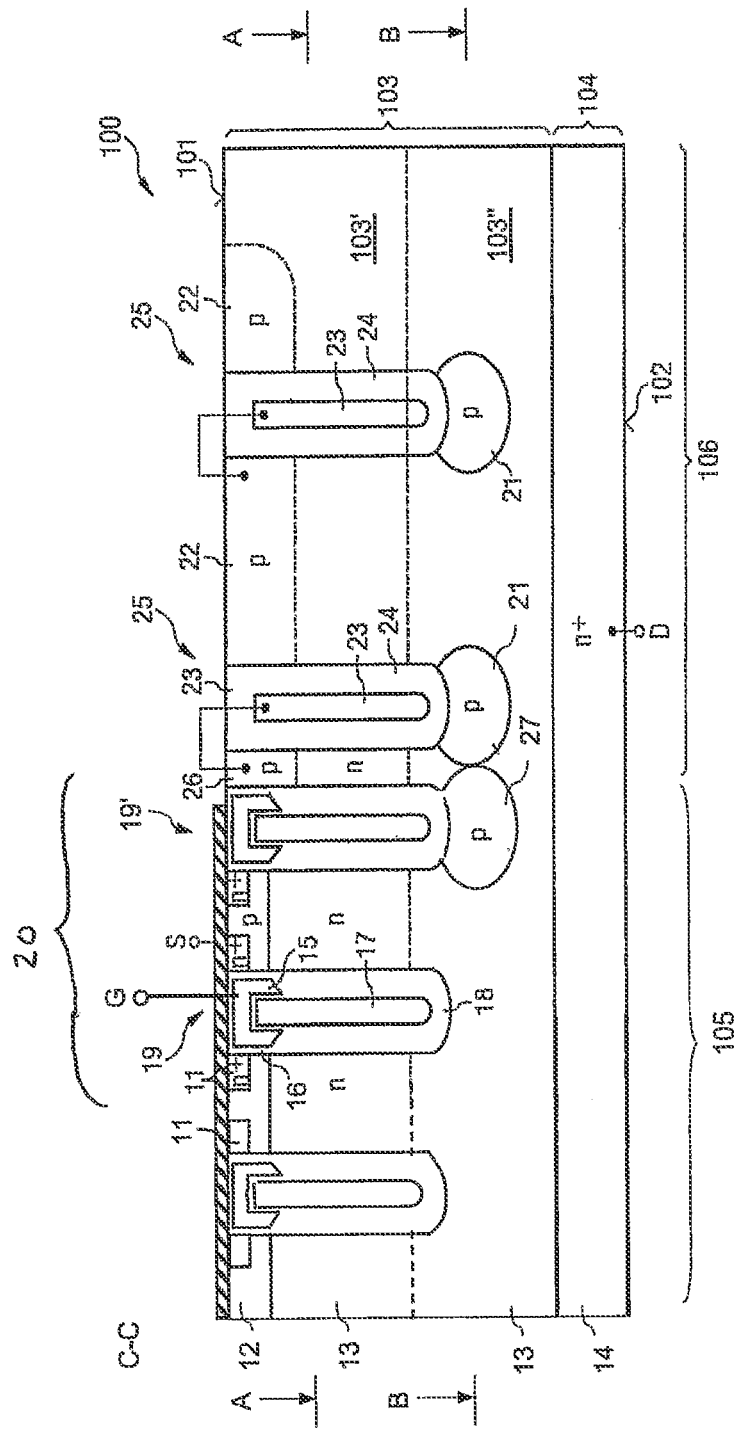
FIG. 7 illustrates a vertical cross sectional view of a semiconductor component according to a further embodiment.

FIG. 7 illustrates a vertical cross sectional view of a semiconductor component according to a further embodiment. The semiconductor component of FIG. 7 is based on the semiconductor component of FIG. 3 and includes a transistor cell array with a plurality of transistor cells in the inner region 105 and an edge termination structure with edge trenches 25 each including an edge electrode 23 and an first edge zone 21 below the edge trench 25. Concerning the features of the semiconductor component of FIG. 7 that are included in the semiconductor component of FIG. 3 the explanation provided in connection with FIG. 3 apply accordingly.

The semiconductor component of FIG. 7 additionally includes at least one cell array edge zone 27 of the second doping type, complementary to the doping type of the semiconductor layer 103. In the embodiment illustrated in FIG. 7, the cell array edge zone 27 is below the outermost trench 19' of the transistor cell array and adjoins the first edge zone 21 below the innermost trench 25 of the edge termination structure. Concerning the doping concentration and the dimension of the cell array edge zone 27, the explanations provided in connection with the first edge zones 21 apply accordingly. Like the first edge zones 21, the at least one cell array edge zone 27 has a doping concentration selected such that the cell array edge zone 27 is depleted completely or almost completely when the transistor is in an off-state. When the device is in an off-state, the drift zone 11 in a region around the cell array edge regions is depleted, which means that there is a depletion region (space charge region) in the drift zone 11 around the cell array edge zone 27. The depletion region in the drift zone 11 causes a depletion region in the cell array edge zone 27. The phrase "completely depleted" in connection with the cell array edge zone 27 means that all the dopant atoms in the cell array edge zone 27 are ionized. The phrase "almost completely depleted" means that there can be region having a diameter of at most the width of the trenches 19, 19' in which there is no depletion region or in which dopant atoms are not ionized. Whether the cell array edge zone 27 can be depleted completely or can be depleted almost completely is dependent on the doping charge in the cell array edge zone and the doping charge in the surrounding drift zone 11. According to one embodiment, the dopant charge in the cell array edge zone 27 is between $1.10^{12}$ (=1e12) cm$^{-2}$ and $5.10^{13}$ (=5e13), in particular between 2e12 cm$^{-2}$ and 2e13 cm$^{-2}$. The "dopant charge" of the cell array edge zone 27 corresponds to the integral of the doping concentration in the cell array edge zone 27 in the vertical direction of the semiconductor body.

The semiconductor layer 103 may include the first and second partial layers 103', 103". The trenches 19 of the cell array may extend into the second partial layer 103". According to one embodiment, the at least one cell array edge zone 27 is completely or almost completely arranged in the second partial layer 103". The phrase "almost completely" means that at least 80%, at least 90%, or even at least 95% of the cell array edge zone 27 are arranged in the second partial layer 103".

FIG. 8 illustrates a horizontal cross sectional view of the semiconductor device of FIG. 7. While in FIG. 7 only a part of the transistor cell array and the edge termination structure adjoining the illustrated part of the transistor cell array are illustrated, FIG. 8 (on a smaller scale) schematically shows the complete transistor cell array and the edge termination structure surrounding the transistor cell array. FIG. 8 illustrates a horizontal cross sectional view in a first horizontal section plane A-A illustrated in FIG. 7. This section plane A-A cuts through the semiconductor body 100 in the semiconductor layer 103 below the body regions 12 and through the transistor trenches 19 and the edge trenches 25. In FIG. 8, only the field electrode dielectric 18 in the transistor trenches and the dielectric layers 25 in the edge trenches 25 are shown. The field electrodes 17 and the edge electrode 23 are not illustrated in FIG. 8.

In the embodiment illustrated in FIG. 8, the transistor trenches 19, except for the outermost transistor trench 19', are elongated trenches. Implementing the transistor trenches 19 as elongated trenches is only an example. These trenches could also be implemented as pile-shaped trenches or as grid-shaped trenches.

The vertical cross sectional view illustrated in FIG. 7 is a sectional view in a section plane C-C extending perpendicular to the longitudinal direction of the elongated transistor trenches 19. The outermost transistor trench 19' surrounds the other transistor trenches 19 in the horizontal plane. Referring to FIG. 7, active transistor regions of the transistor, namely body and source regions 11, 12 connected to the source electrode are arranged in the semiconductor mesa region between the outermost transistor trench 19' and neighboring transistor trenches, but are not arranged outside the outermost transistor trench 19' in the direction of the edge termination structure. Thus, the outermost transistor trench 19' "terminates" the transistor cell array in the horizontal or lateral direction of the semiconductor body 100. Theoretically, semiconductor regions corresponding to the source regions and semiconductor regions corresponding to the body regions could also be arranged outside the cell region. These regions, however, are not connected to the source electrode 11, so that these regions are not active regions of the transistor. According to one embodiment, the source region 11 adjoining the outermost trench 19' and, optionally, the source region adjoining the trench directly adjacent the outermost trench 19' are omitted. Nevertheless, the body region 12 between the outermost trench 19' and the adjacent trench is connected to the source electrode 11.

In general, the cell array edge zone 27 is arranged in an edge region 20 of the cell array. The "edge region" 20 of the cell array is a region along the outermost trench 19' or along the edge of the cell array and includes the outermost trench 19' and has a size of between 0.1% and 2% of the overall size of the cell array.

Referring to FIG. 8, the edge trenches 25 are ring-shaped and surround the transistor cell array in the horizontal plane. In the embodiment illustrated in FIG. 8, the outermost transistor trench 19' and the edge trench 25 are basically rectangular. However, this is only an example. These trenches could be implemented with any other type of a ring-shaped geometry for as well. The outermost trench 19' could also be implemented as an elongated trench, corresponding to the other trenches 19 in the cell array. In this case, along those sides of the cell array where the longitudinal ends of the trenches are located and where the outermost trench 19' is not located, edge zones corresponding to the edge zone 27 are located below the longitudinal ends of the individual trenches 19.

FIG. 9 illustrates a horizontal cross sectional view of the semiconductor device of FIG. 7 in a second horizontal section plane B-B. The second horizontal section plane B-B extends through the first edge zones 21 and the cell array edge zone 27. The position of the transistor trenches and the edge trenches relative to the first edge zones 21 and the cell array edge zone 27 are illustrated in dotted lines in FIG. 9.

Referring to FIG. 9, the form or geometry of the first zones 21 below the edge trenches 25 correspond to the form or geometry of the edge trenches 25, so that the first edge zones 21 have the form of a ring in the horizontal section plane B-B. According to a further embodiment (not illustrated) a plurality of first edge zones 21 is arranged below each of the edge trenches 25. The individual first zones 21 below one edge trench are distant in the lateral direction. Further, the form or geometry of the cell array edge zone 27 corresponds to the form or geometry of the outermost transistor trench 19'. According to a further embodiment, there is a plurality of cell array edge zones 27 below the outermost trench 19' that are mutually distant and that are located along the outermost trench 19'.

The operating principle of the semiconductor component of FIG. 7 with the at least one cell array edge zone 27 is explained in the following. For explanation purposes it is assumed that the semiconductor component is an n-type MOSFET (as illustrated in FIG. 7) with an n-doped drift region 13, an n-doped drain region 14, n-doped source regions 11 and p-doped body regions 12. The basic principle, however, also applies to a p-type MOSFET.

It is commonly known that a MOSFET, in particular a power MOSFET, can be operated as a diode (body diode) when it is reverse biased. An n-type MOSFET is reverse biased when a positive voltage is applied between the source terminal S and the drain terminal D. In this case, the MOSFET acts like a p-i-n diode with the body zone 12, that is connected to the source electrode, as an anode and the drain zone 14 as a cathode.

When the MOSFET is reverse biased and a current flows through the MOSFET, there is a charge carrier plasma in the drift region 13. This charge carrier plasma includes p-type charge carriers injected into the drift region 13 from the body region 12, and n-type charge carriers injected into the drift region 13 from the drain region 14. This charge carrier plasma is not only present in the drift region 13 in the transistor cell array or the inner region 105 but also extends into the edge region 106.

For further explanation it is assumed that the MOSFET switches from the reverse biased state to the forward biased state. An n-type MOSFET is in the forward biased state when a positive voltage is applied between the drain terminal D and the source terminal S. In the forward biased state the pn-junction between the body zone 12 and the drift zone 13 is reverse biased. In the forward biased state the MOSFET can be switched on and off in a conventional manner by applying a suitable drive potential to the gate electrode G. When the MOSFET switches from the reverse biased state into the forward biased state the minority charge carriers, which are p-type charge carriers in an n-type MOSFET, are removed from the drift region 13. This is independent of whether the forward biased MOSFET is in an on-state or in an off-state. These p-type charge carriers flow through the semiconductor mesa regions between the transistor trenches 19 to the body regions 12 when the MOSFET switches from the reverse biased state into the forward biased state. In this process, p-type charge carriers from the edge region 106 first flow in a lateral direction of the semiconductor body 100 into the transistor cell array and then flow in a vertical direction to one of the body regions 12. Due to the p-type charge carriers from the edge region 106 a p-type charge carrier current is higher in those mesa regions of the transistor cell array closer to the outermost transistor trench 19' than in semiconductor mesa regions more distant to the outermost transistor trench 19'. A high p-type charge carrier flow in one mesa region, however, may cause a breakthrough of the semiconductor component. When the transistor is in the forward biased state and in the off-state, there are ionized charge carriers in the mesa region between the outermost trench 19' and the adjacent trench 19, but also in the mesa region between the other trenches 19. These ionized dopant atoms have a positive charge when the drift region 11 is n-doped.

In conventional transistor devices, the ionized dopant atoms in the drift region have corresponding ionized (complementary) dopant atoms in the body region. An avalanche breakthrough occurs, when the electric field at the pn junction between the drift region and the body region reaches a critical value ($E_{crit}$). The voltage at which the critical value is reached is dependent on the doping concentration of the drift region and decreases when the doping concentration of the drift region is increased.

In the semiconductor device of FIG. 7, p-type charge carriers flowing from the edge region 106 through the mesa regions in the edge region of the cell array, have the same effect as a locally increased doping concentration in these mesa regions and would result in a reduced voltage blocking capability in this area, if no additional measures would be taken. These measures include the provision of the cell array edge region 27. The cell array edge region 27 is doped complementary to the mesa regions and includes ionized dopant atoms when the transistor device is in the off-state. These ionized dopant atoms, that have a negative charge when the cell array edge region 27 is p-doped, compensate the additional charge provided by the p-type charge carriers from the edge region and/or partly compensate the dopant charges in those mesa regions below which the edge region 27 is located. By virtue of this compensation effect, p-type charge carriers from the edge region 106 do not cause a significant increase of the electric field in those mesa regions where they are flowing.

Further, the cell array edge zone 27 below the outermost transistor trench 19' provides a low-ohmic path for p-type charge carriers below the outermost transistor trench 19' and helps to contact p-type charge carriers travelling in the lateral direction of the semiconductor body 100 deeper into the transistor cell array and, therefore, helps to more equally distribute p-type charge carriers from the edge region 106 to several semiconductor mesa regions in the transistor cell array.

Figure 10:
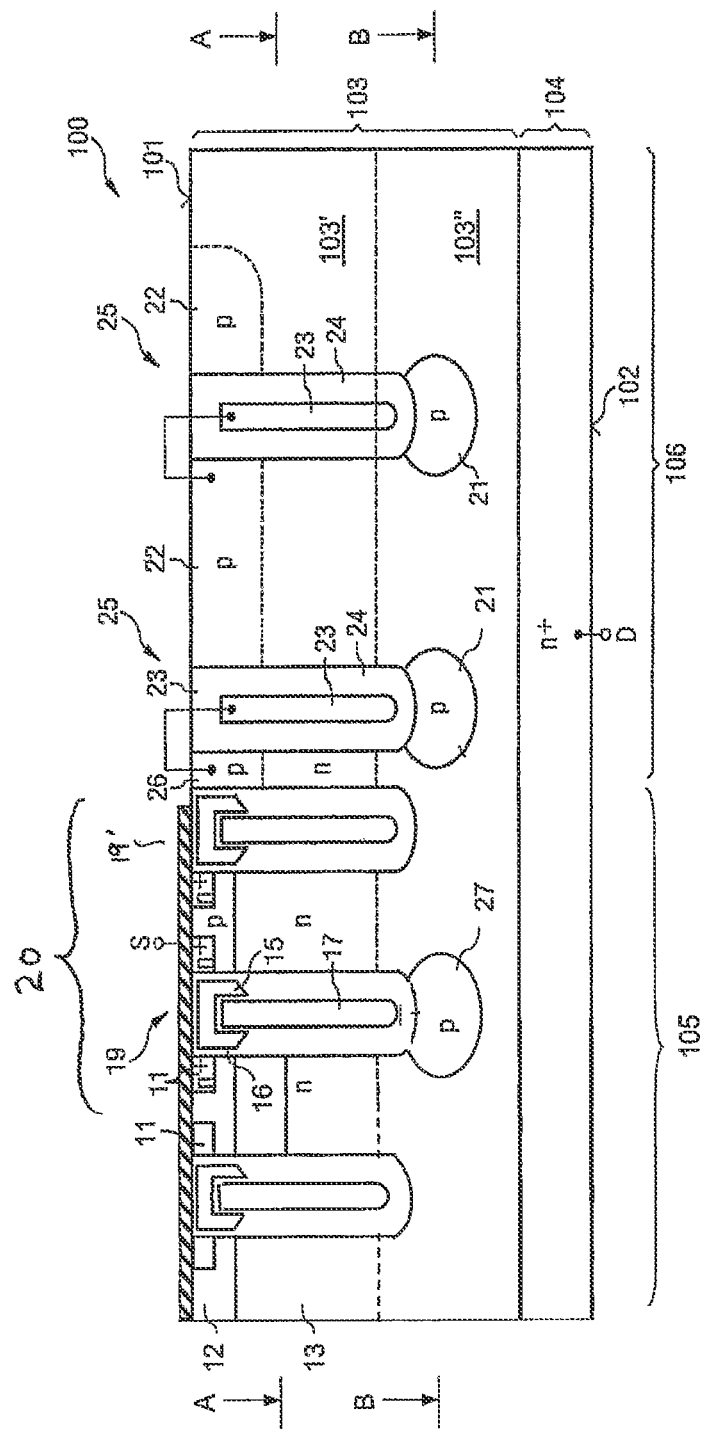
FIG. 10 illustrates a vertical cross sectional view of a semiconductor component according to yet another embodiment.

FIG. 10 illustrates a further embodiment of a semiconductor component with a cell array edge zone 27. In this embodiment, the cell array edge zone 27 is below a transistor trench 19 adjacent the outermost 19'.

Figure 11:
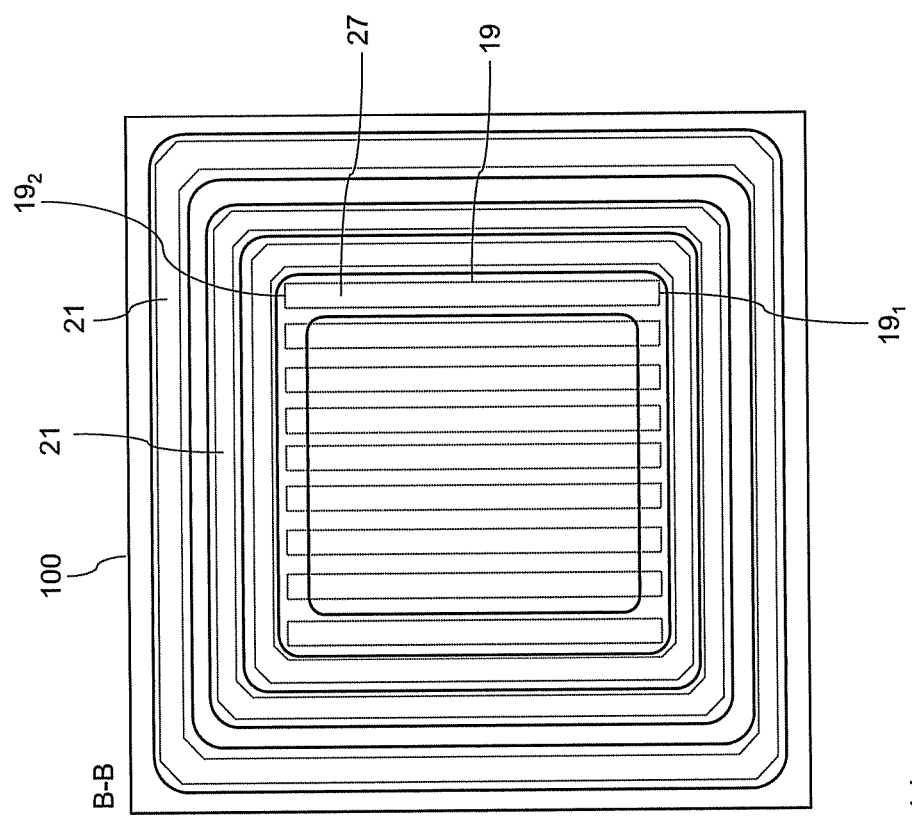
FIG. 11 illustrates a horizontal cross sectional view of the semiconductor component of FIG. 10 in the second horizontal plane.

Referring to FIG. 11, that shows a horizontal cross sectional view of the semiconductor device of FIG. 10 in the second horizontal section plane B-B, the cell array edge zone 27 cell array edgeis not only arranged below the two elongated transistor trenches 19 extending parallel to the outermost trench 19', but is also arranged below the longitudinal ends $19_1$, $19_2$ of the other transistor trenches 19. The longitudinal ends $19_1$, $19_2$ of the transistor trenches 19 are adjacent the outermost ring-shaped trench 19'. The cell array edge region 27 can be ring shaped. However, in particular in those regions of the cell array where the cell array edge region 27 is below the longitudinal ends $19_1$, $19_2$ of the (inner) trenches 19, a plurality of cell array edge regions 27 that are mutually distant can be provided.

In general, the cell array edge regions 27 are, for example, produced by implanting and/or diffusing dopant atoms of the second conductivity type via the bottoms of those trenches below which cell array edge regions 27 are desired, before the field electrodes 17 and gate electrodes 15 are produced in these trenches. In the transistor device of FIG. 11, the cell array edge regions 27 can be produced by implanting and/or diffusing dopant atoms into the drift region 11 via the bottoms of the two elongated transistor trenches 19 extending parallel to the outermost trench 19', and by implanting and/or diffusing dopant atoms via the bottoms of the other transistor trenches 19 at their longitudinal ends. Dependent on how deep the dopant atoms are implanted and dependent on the distance between two neighboring trenches 19, the cell array edge zones 27 formed below the longitudinal ends $19_1$, $19_2$ of the individual trenches 19 are distant or neighboring edge zones 27 adjoin each other, so as to form one ring-shaped cell array edge zone 27.

According to a further embodiment (illustrated in dashed lines in FIG. 10) a cell array edge zone 27 is also located below the outermost transistor trench 19'. The two cell array edge zones 27, namely the edge zone below the outermost trench 19' and the edge zone below the adjacent transistor trench 19 do not adjoin each other. The implementation of the cell array edge zone 27 is not restricted to the outermost trench 19' and the adjacent trench. In general, the cell array edge zone 27 can be implemented below each of the trenches or below each section of a trench that is located in the edge region of the cell array.

Figure 12:
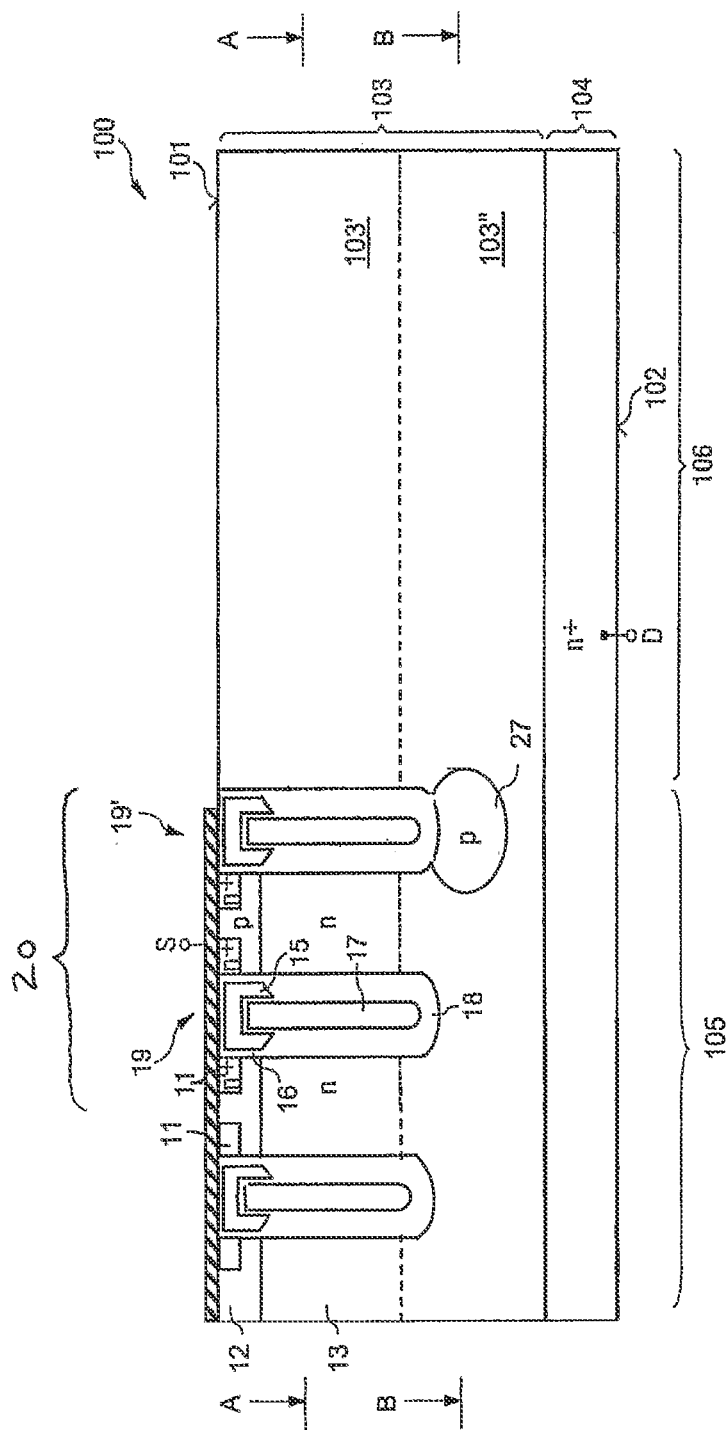
FIG. 12 illustrates a vertical cross sectional view of a semiconductor component according to a further embodiment.

Implementing the at least one cell array edge zone 27 as explained with reference to FIGS. 7 to 11 is not restricted to a semiconductor component having a field electrode 23 in the edge trench. The cell array edge zone 27 can also be implemented in a semiconductor device in which the edge trench 25 is completely filled with a dielectric material 24, as illustrated in FIG. 4. Thus, in each of the embodiments illustrated in FIGS. 7 to 11 the edge electrode 23 can be omitted. According to a further embodiment, the edge trenches 25 with the first edge zones 21 are omitted. In this embodiment, the cell array edge regions 27 in the edge region of the cell array replaces the edge termination structure with the edge trenches. This is illustrated in FIG. 12.

Figure 13:
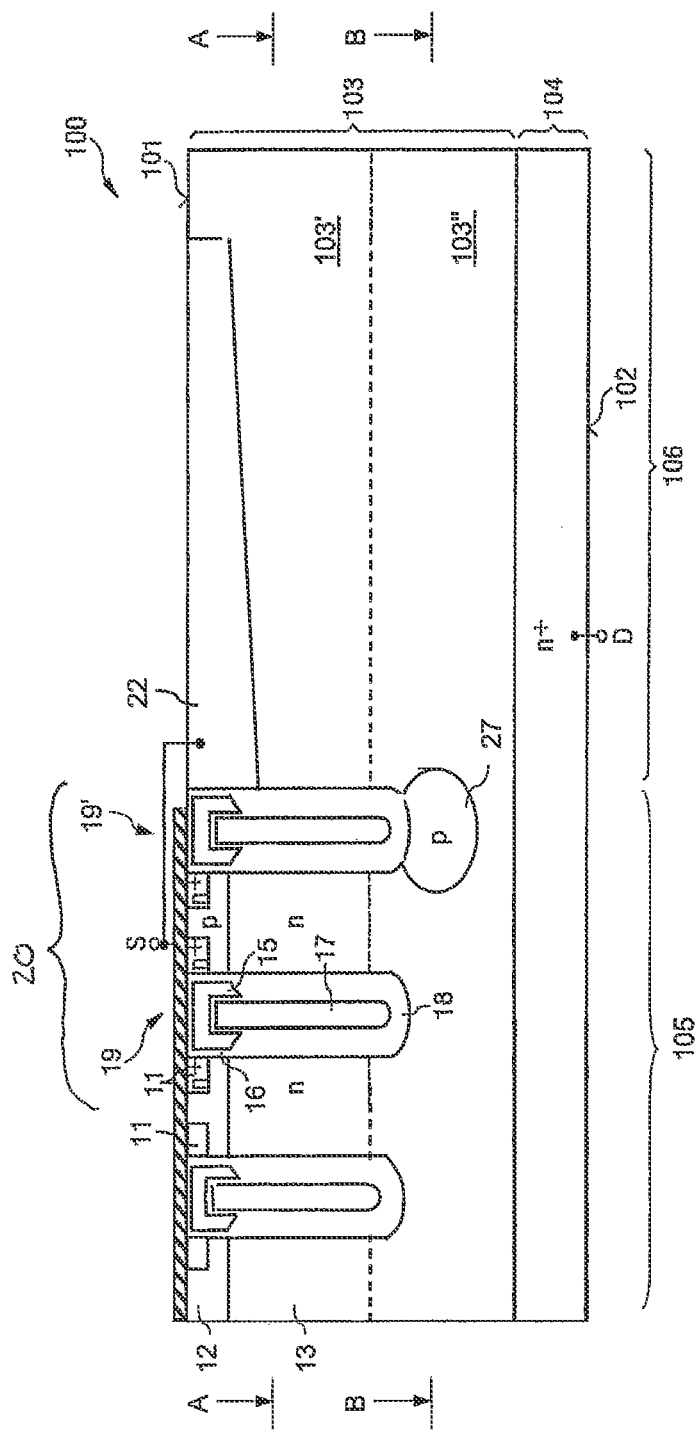
FIG. 13 illustrates a vertical cross sectional view of a semiconductor component according to yet another embodiment.

According to a further embodiment, the edge trenches 25 are replaced with a conventional edge termination structure, such as an edge termination structure including field rings or a VLD region (VLD: Variation of Lateral Doping). An embodiment of a semiconductor device with a VLD edge termination structure is illustrated in FIG. 13. In this embodiment, the semiconductor region 22 is implemented as a VLD region and connected to the source terminal S.

Further, implementing the cell array edge zone is not restricted to a MOSFET but can also be applied in a pn-diode or a Schottky diode having a cell array with field electrodes 17 arranged in trenches 18.

It should be noted, that the edge structures explained before are not restricted to be used in MOS transistors, diodes or Schottky diodes, but may be used in any vertical power semiconductor component, in particular bipolar transistors. A bipolar transistor is basically different from the explained MOS transistors in that it does not comprise a gate electrode. Source zone, body zone and drain zone of a MOS transistor correspond to emitter zone, basis zone and collector zone of a bipolar transistor. A bipolar transistor is controlled via its basis zone.

It should be further noted, that the explained edge structure may also be used in components without compensation structure, i.e. without field electrode.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor component comprising:
   a semiconductor body comprising a first side and a second side, and a first semiconductor layer having a basic doping of a first conductivity type;
   at least one active component zone of a second conductivity type, which is complementary to the first conductivity type, in the first semiconductor layer;
   a cell array with a plurality of trenches, each trench including a field electrode and a field electrode dielectric, wherein in the cell array the at least one active component zone of the second conductivity type is electrically connected to an electrode, the cell array including an edge region, wherein the edge region of the cell array includes at least an outermost trench of the cell array and a trench of the cell array adjacent to the outermost trench; and
   at least one cell array edge zone of the second conductivity type, the at least one cell array edge zone arranged only in the edge region of the cell array at least partially below and having an interface with at least one trench in the edge region of the cell array, wherein the cell array edge zone is spaced apart from the first side of the semiconductor body,
   wherein the semiconductor component is implemented as a MOS transistor and comprising in the inner region a plurality of transistor cells, each transistor cell comprising: a source zone of a first conductivity type, a drift zone of the first conductivity type, and a body zone of the second conductivity type between the source zone and the drift zone; a gate electrode being disposed adjacent to the body zone and being insulated against the body zone by a gate dielectric, and wherein the gate electrodes of the transistor cells are arranged in the same trenches as the field electrodes, the field electrodes extending deeper into the semiconductor body than the gate electrodes.

2. The semiconductor component of claim 1, wherein the semiconductor body comprises a semiconductor body inner region and a semiconductor body edge region, wherein the first semiconductor layer extends across the semiconductor body inner region and the semiconductor body edge region, and wherein the at least one active component zone is only in the semiconductor body inner region.

3. The semiconductor component of claim 2, further comprising:
   an edge structure in the semiconductor body edge region.

4. The semiconductor component of claim 3, wherein the edge structure comprises:
   at least one edge trench extending from the first side into the semiconductor body;
   a dielectric layer in the semiconductor body edge region; and
   a first edge zone of the second conductivity type adjoining the at least one edge trench and being at least partially disposed below the at least one edge trench.

5. The semiconductor component of claim 4, wherein the cell array edge zone adjoins one edge zone in the lateral direction of the semiconductor body.

6. The semiconductor component of claim 4, wherein the outermost trench of the cell array is adjacent to the at least one edge trench, and wherein the cell array edge zone adjoins the outermost trench of the cell array.

7. The semiconductor component of claim 6, wherein the outermost trench is ring-shaped and terminates the cell array in a lateral direction of the semiconductor body.

8. The semiconductor component of claim 4, wherein the cell array edge zone is distant to the first edge zone.

9. The semiconductor component of claim 4, further comprising:
a second edge zone of the second conductivity type separated from the first edge zone, laterally adjoining the at least one edge trench and adjoining the first side.

10. The semiconductor component of claim 4, wherein the first edge zone has a doping concentration such that the first edge zone can be completely depleted or can be depleted except for an area having dimensions smaller than a lateral width of the edge trench when a transistor of which the at least one trench of the cell array is a part is in an off-state.

11. The semiconductor component of claim 1, wherein the edge region of the cell array extends along an edge of the cell array and has a size of between 0.1% and 2% of a size of the cell array in a horizontal plane of the semiconductor body.

12. The semiconductor component of claim 1, wherein the cell array edge zone of the cell array is ring-shaped in a horizontal plane of the semiconductor body.

13. The semiconductor component of claim 1, further comprising:
an edge electrode in at least one edge trench, the edge electrode separated from the semiconductor body by the an edge dielectric.

14. The semiconductor component of claim 13, wherein the at least one edge trench is completely filled with the edge dielectric.

15. The semiconductor component of claim 13, wherein the edge electrode is electrically coupled to a semiconductor zone doped complementary to a basic doping of the semiconductor layer and arranged between the at least one edge trench and the inner region.

16. The semiconductor component of claim 15, wherein the semiconductor zone adjoins the at least one edge trench.

17. The semiconductor component of claim 1, wherein the at least one cell array edge zone has a doping concentration such that the cell array edge zone can be completely depleted or can be depleted except for an area having dimensions smaller than a lateral width of the edge trench when a transistor of which the at least one trench of the cell array is a part is in an off-state.

18. The semiconductor component of claim 1, further comprising:
at least two edge trenches, the at least two edge trenches being disposed distant to each other in a lateral direction of the semiconductor body; and
a number of first edge zones corresponding to the number of trenches.

19. The semiconductor component of claim 18, comprising a number of second edge zones corresponding to the number of trenches, with each of the second edge zones adjoining one edge trench in a direction opposite to the direction of the inner region.

20. The semiconductor component of claim 19, wherein each of the second edge zones are disposed between two edge trenches and extend in a lateral direction from trench to trench.

21. The semiconductor component of claim 1, wherein the edge region of the cell array includes fewer than all trenches of the cell array.

22. A semiconductor component comprising:
a semiconductor body comprising a first side and a second side, and a first semiconductor layer having a basic doping of a first conductivity type;
at least one active component zone of a second conductivity type, which is complementary to the first conductivity type, in the first semiconductor layer;
a cell array with a plurality of trenches, each trench including a field electrode and a field electrode dielectric, wherein in the cell array the at least one active component zone of the second conductivity type is electrically connected to an electrode, the cell array including an edge region, wherein the edge region of the cell array includes at least an outermost trench of the cell array and a trench of the cell array adjacent to the outermost trench; and
at least one cell array edge zone of the second conductivity type, the at least one cell array edge zone arranged only in the edge region of the cell array at least partially below and having an interface with at least one trench in the edge region of the cell array, wherein the cell array edge zone is spaced apart from the first side of the semiconductor body, wherein the semiconductor layer comprises a first partial layer and a second partial layer below the first partial layer and having a lower doping concentration than the first partial layer.

23. The semiconductor component of claim 22, wherein the plurality of trenches of the cell array extends into the second partial layer.

* * * * *